(12) United States Patent
Kiyota

(10) Patent No.: US 11,390,047 B2
(45) Date of Patent: Jul. 19, 2022

(54) OPTICAL COMPONENT, METHOD OF MANUFACTURING SAME, AND LIGHT EMITTING DEVICE

(71) Applicant: NICHIA CORPORATION, Anan (JP)

(72) Inventor: Seiji Kiyota, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/164,220

(22) Filed: Feb. 1, 2021

(65) Prior Publication Data

US 2021/0156525 A1    May 27, 2021

Related U.S. Application Data

(63) Continuation of application No. 16/596,251, filed on Oct. 8, 2019, now Pat. No. 10,935,194.

(30) Foreign Application Priority Data

Oct. 10, 2018    (JP) .............................. JP2018-191403

(51) Int. Cl.
| | |
|---|---|
| *F21K 9/65* | (2016.01) |
| *B29D 11/00* | (2006.01) |
| *F21K 9/68* | (2016.01) |
| *F21V 7/04* | (2006.01) |
| *H01S 5/00* | (2006.01) |

(52) U.S. Cl.
CPC ............ *B29D 11/0074* (2013.01); *F21K 9/65* (2016.08); *F21K 9/68* (2016.08); *F21V 7/04* (2013.01); *H01S 5/005* (2013.01); *H01S 5/0087* (2021.01)

(58) Field of Classification Search
None
See application file for complete search history.

(56) References Cited

U.S. PATENT DOCUMENTS

| | | | |
|---|---|---|---|
| 5,438,586 A | 8/1995 | Ishii et al. | |
| 5,479,426 A * | 12/1995 | Nakanishi | H01S 5/02257 372/50.1 |
| 5,793,785 A * | 8/1998 | Nakanishi | H01S 5/02255 372/36 |
| 6,810,057 B1 * | 10/2004 | Itoh | G11B 7/22 372/50.1 |
| 2003/0129423 A1 * | 7/2003 | Mastromatteo | G11B 7/1362 428/450 |

(Continued)

FOREIGN PATENT DOCUMENTS

| | | |
|---|---|---|
| JP | 2002-055211 A | 2/2002 |
| JP | 2003-233926 A | 8/2003 |

(Continued)

OTHER PUBLICATIONS

Notice of Allowance on U.S. Appl. No. 16/596,251 dated Nov. 2, 2020.

*Primary Examiner* — Elmito Breval
(74) *Attorney, Agent, or Firm* — Foley & Lardner LLP

(57) ABSTRACT

An optical component includes: an upper surface; a lower surface; a first light reflecting surface extending at least partially between the upper surface and the lower surface, the first light reflecting surface comprising a flat surface; and a rounded region formed between the first light reflecting surface and the lower surface. An angular edge is located at a first light reflecting surface side of the upper surface.

19 Claims, 7 Drawing Sheets

(56) References Cited

U.S. PATENT DOCUMENTS

| | | | | |
|---|---|---|---|---|
| 2007/0086095 A1* | 4/2007 | Wang | ............. | G02B 5/08 |
| | | | | 359/871 |
| 2011/0158273 A1* | 6/2011 | Okayama | ............. | H01L 24/97 |
| | | | | 372/43.01 |
| 2016/0285234 A1 | 9/2016 | Okahisa | | |
| 2017/0033528 A1* | 2/2017 | Tanisaka | ............. | H01S 5/02326 |
| 2017/0170625 A1* | 6/2017 | Halbritter | ............. | H01S 5/02257 |
| 2017/0213944 A1* | 7/2017 | Naka | ............. | H01L 33/60 |
| 2017/0351110 A1* | 12/2017 | Gurgov | ............. | G02B 19/0028 |
| 2018/0083169 A1* | 3/2018 | Naka | ............. | H01L 33/52 |
| 2019/0058303 A1* | 2/2019 | Miura | ............. | H01S 5/0071 |
| 2019/0234565 A1* | 8/2019 | Kitajima | ............. | F21V 11/16 |

FOREIGN PATENT DOCUMENTS

| | | |
|---|---|---|
| JP | 2006-220774 A | 8/2006 |
| JP | 2011-178576 A | 9/2011 |
| JP | 2016-184729 A | 10/2016 |

\* cited by examiner

OPTICAL COMPONENT, METHOD OF MANUFACTURING SAME, AND LIGHT EMITTING DEVICE

CROSS-REFERENCE TO RELATED APPLICATIONS

The present application is a continuation of U.S. patent application Ser. No. 16/596,251, filed on Oct. 8, 2019, which claims priority to Japanese Patent Application No. 2018-191403, filed on Oct. 10, 2018, the disclosures of which are hereby incorporated by reference in their entireties.

BACKGROUND

The present disclosure relates to an optical component, a method of manufacturing the optical component, and a light emitting device including the optical component.

A method has been known in which glass is molded into a predetermined shape with a mold, and a plurality of pieces of glass identical in shape are divided from one another to manufacture a plurality of glass components identical in shape (for example Japanese Patent Publication No. 2011-178576). A glass component manufactured in this way may be provided with a reflective film on its surface, then the glass component can be used as an optical component having reflectivity.

SUMMARY

When a shape is formed with a mold using the method described in the Japanese Patent Publication No. 2011-178576, there are cases in which the component is formed with a shape insufficient to a desired degree of accuracy. This may affect the mounting accuracy at the time of mounting an optical component in manufacturing of a light emitting device.

According to one embodiment, a method of manufacturing an optical component includes: providing a base, the base including a projection which has an upper surface, a plurality of lateral surfaces, a first light control region positioned on at least one of the lateral surfaces, a first non-light-control region continued from the first light control region, and a second non-light-control region on a side closer to the upper surface than the first light control region, the first light control region being present between the first non-light-control region and the second non-light-control region in a direction perpendicularly extending from the upper surface of the projection; forming a lower surface of the optical component by processing a lower surface of the base such that the first non-light-control region in the base remains; and forming an upper surface of the optical component by processing an upper surface of the base to remove the second non-light-control region before or after forming the lower surface of the optical component. The optical component manufactured by the method has the first light control region and the first non-light-control region on the at least one lateral surface.

According to another embodiment, an optical component having an upper surface, a lower surface, a plurality of lateral surfaces, and a light reflecting surface provided on at least one of the lateral surfaces, comprising: a first light control region provided on the light reflecting surface, and a first non-light-control region continuous with the first light control region between the first light control region and the lower surface in a direction extending perpendicularly from the upper surface of the projection. The optical component has an angular boundary between the upper surface and the light reflecting surface.

According to another embodiment, a light emitting device includes: a base member having a first upper surface; a semiconductor laser element disposed on the first upper surface; and the light reflecting member described above, which is disposed on the first upper surface and configured to reflect light from the semiconductor laser element.

According to the optical component and the method of manufacturing the optical component of the present disclosure, it is possible to provide an optical component with a high degree of accuracy.

DETAILED DESCRIPTION

Figure 1:
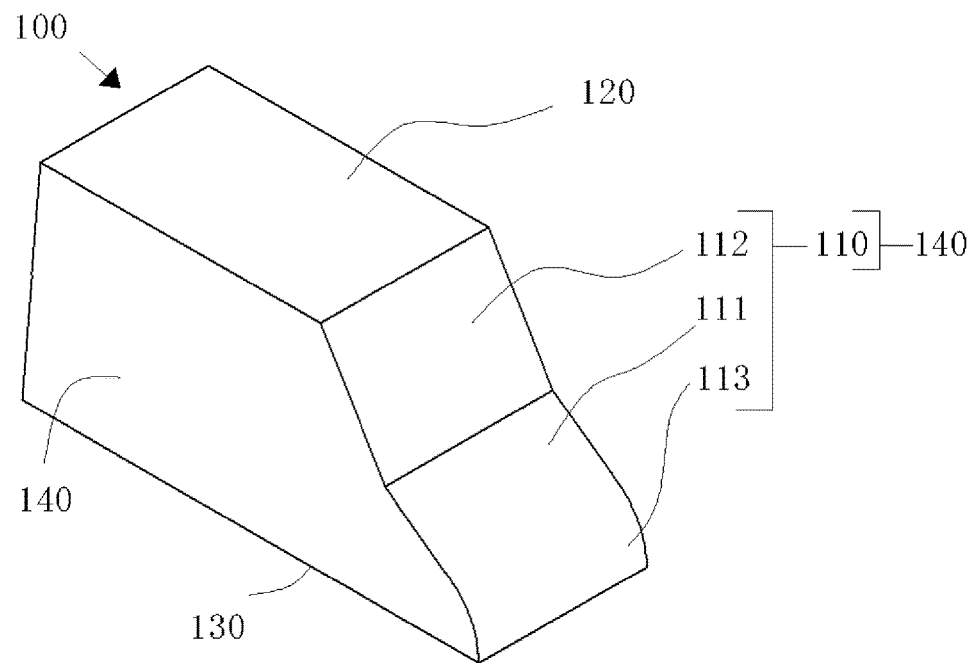
FIG. 1 is a perspective view of an optical component according to an embodiment.

Embodiments of the present disclosure will be described below with reference to the drawings. It is to be noted that the embodiments shown below are intended to embody the technical ideas of the present invention, and are not intended to limit the present invention. The same names and the same reference numerals represent the same or substantially the same components, and repeated descriptions of such components will be omitted. The sizes and positional relations of members shown in the drawings may be exaggerated for clarification of explanation.

FIG. 1 is a schematic view of an optical component 100 according to the embodiment of the present disclosure. The optical component 100 has an upper surface 120, a lower surface 130 and lateral surfaces 140, and a light reflecting surface 110 is formed at some of the lateral surfaces 140. The upper surface 120 and the lower surface 130 include flat surfaces parallel to each other. The upper surface 120 and the lower surface 130 are not required to be parallel to each other. Further, the upper surface 130 and the lower surface 120 are rectangular flat surfaces, the lower surface 130 has an area larger than that of the upper surface 120. In a top view, the boundary between the upper surface 120 and the light reflecting surface 110 is present within a region surrounded by the outer periphery of the lower surface, and positioned between a side of the lower surface 130 crossing the light reflecting surface 110, and a side on the opposite side. The term "rectangular" in the present specification may include a square.

Except for the light reflecting surface 110, the lateral surfaces 140 include a plurality of flat surfaces meeting the upper surface 120 and the lower surface 130. Among these lateral surfaces 140, two lateral surfaces 140 meeting the light reflecting surface 110 include flat surfaces parallel to each other. Further, the two lateral surfaces 140 include flat surfaces perpendicular to the lower surface 130 and the upper surface 120. The two lateral surfaces are not required to be parallel to each other. The two lateral surfaces are not required to be perpendicular to the lower surface 130 or the upper surface 120.

A lateral surface 140 on a side opposite to the light reflecting surface 110 is inclined as extending from the upper surface 120 to the lower surface 130. This lateral surface may be perpendicular to the upper or lower surfaces. This lateral surface 140 is inclined at a draft angle which facilitates release from a mold. The angle formed by this lateral surface 140 with the lower surface 130 is preferably 82 degrees to 90 degrees, more preferably 85 degrees to 87 degrees.

The light reflecting surface 110 has a first light control region 111 and a second light control region 112. Further, the light reflecting surface 110 has a first non-light-control region 113. In the present specification, the light control region is a region designed to intentionally control the advancing direction of light so that light radiated from a semiconductor laser element as described later is reflected at the region to advance toward a specific location. The non-light-control region is a region which is not intended to intentionally control the advancing direction of light regardless of whether or not the region has light-reflectivity and regardless of whether or not the region is irradiated with light.

The optical component 100 has two flat surfaces different in angle with respect to the lower surface 130 at the light reflecting surface 110, and these flat surfaces correspond to the first light control region 111 and the second light control region 112. Of these flat surfaces, a flat surface on a side closer to the lower surface 130 is the first light control region 111, and a flat surface on a side closer to the upper surface 120 is the second light control region 112. The first light control region 111 or the second light control region 112 is not required to be the flat surface, but may be the curved surface. In the present embodiment, the angle with respect to the lower surface 130 is an angle formed by the lower surface 130 with a straight line connecting both ends of the region or a flat surface connecting the four corners of the region.

Further, the first non-light-control region 113 continued from the first light control region 111 is present between the lower surface 130 and the first light control region 111. The first non-light-control region 113 is a curved surface, which is not intentionally formed into curved surface but is a region formed as a result of forming the first light control region 111 in a process of manufacturing the optical component 100. As described in detail later, a second non-light-control region 114 is also generated as a result of forming the second light control region 112 in the process of manufacturing the optical component 100, but the second non-light-control region 114 is removed.

In the optical component 100, the upper surface 120 and the second light control region 112 meet each other. Further, the second light control region 112 meets the first light control region 111 on a side opposite to a side on which the second light control region 112 meets the upper surface 120. That is, the first light control region 111 and the second light control region 112 are connected to each other. Rather than being connected, another region (i.e. an intermediate region) may be provided between these regions. For example, a third light control region may be further present as an intermediate region. The light reflecting surface 110 may have three or more light control regions. The light reflecting surface 110 may have a structure in which only one light control region is present. For example, only the first light control region 111 may be present as a light control region.

The optical component 100 is prepared using borosilicate glass as a principal material. For example, an outer shape of the optical component 100 as shown in FIG. 1 is formed by molding glass, and a reflecting film is provided in a region to be the light reflecting surface 110, thereby providing the optical component 100. The optical component 100 may have a metal film provided on the lower surface. As the principal material of the optical component 100, for example, optical glass containing additives or the like can be used besides borosilicate glass.

A method of manufacturing the optical component 100 will now be described with reference to FIGS. 2 to 10.

Figure 2:
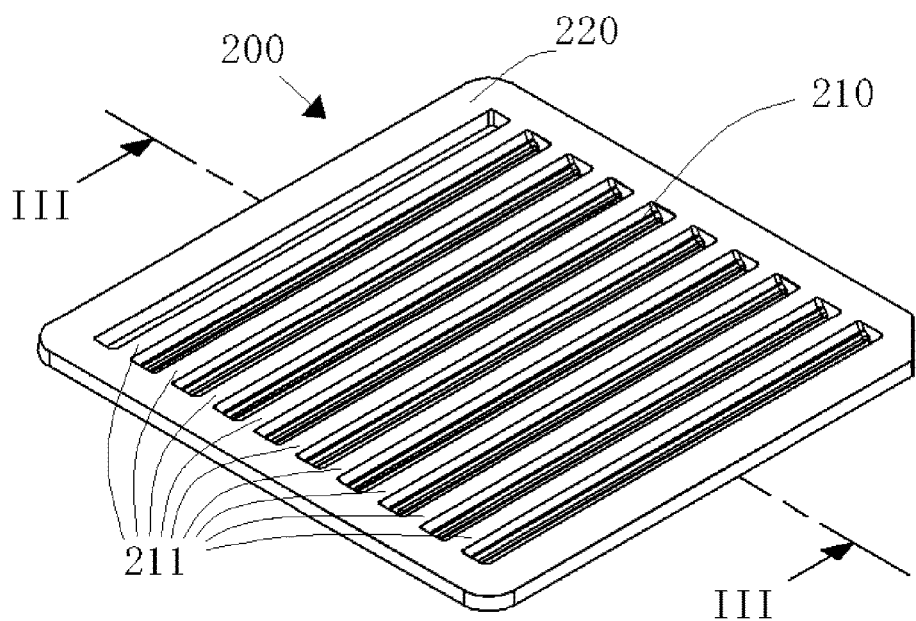
FIG. 2 is a perspective diagram showing a state of optical component in one of the steps in the manufacturing method thereof.

FIG. 2 is a perspective diagram showing a state in which a base 200 is molded using a mold in manufacturing of the optical component 100. The base 200 is formed using a principal material for the optical component 100 as described above. As shown in FIG. 2, the base 200 has a component region 210 as a region which is processed to manufacture the optical component 100, and an outer peripheral region 220 surrounding the component region 210.

Figure 3:
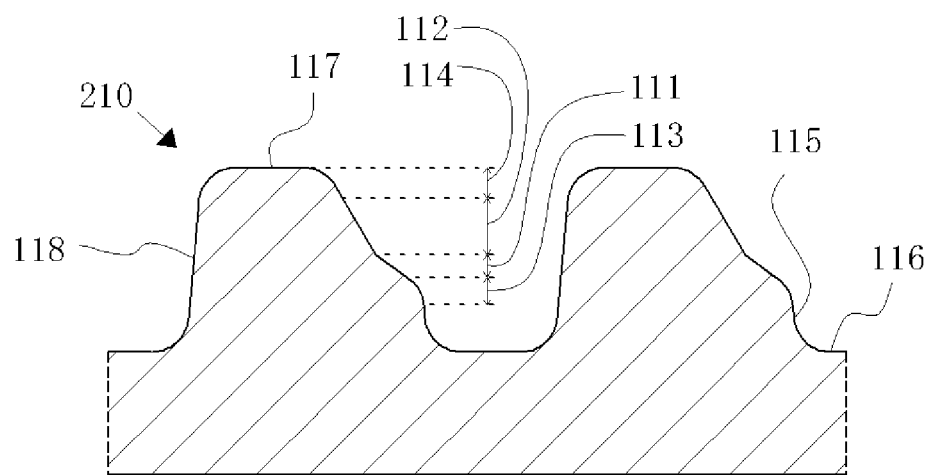
FIG. 3 is a sectional view taken along line in FIG. 2.

In the component region 210, a projection 211 having a shape corresponding to a lateral surface on a side on which the light reflecting surface 110 of the optical component 100 is formed and a lateral surface on the opposite side is provided. The projection 211 is provided in a shape extending to the outer peripheral region 220 from one lateral surface of the base 200 toward a lateral surface on the opposite side. Further, a plurality of projections 211 is arranged side by side at equal intervals, and adjacent projections 211 are arranged parallel to each other so as to ensure constant intervals. The projections are not required to be arranged at equal intervals, and may be arranged at predetermined intervals. FIG. 3 is a diagram for illustrating the shape of a plurality of projections 211 provided in the component region 210, and is a partial sectional view taken along line in FIG. 2.

In the projection 211, a lateral surface on a side corresponding to the light reflecting surface 110 has the first light control region 111, the second light control region 112, the first non-light-control region 113 and the second non-light-control region 114. Further, the first non-light-control region 113 continued from the first light control region 111 is formed, and the first light control region 111 is present between the first non-light-control region 113 and the second light control region 112 in a direction perpendicularly extending from the upper surface of the projection. Similarly, the second non-light-control region 114 continued from the second light control region 112 is formed, and the second light control region 112 is present between the second non-light-control region 114 and the first light control region 111.

Therefore, the regions are formed such that the second non-light-control region 114, the second light control region 112, the first light control region 111 and the first non-light-control region 113 are arranged in this order from the side close to the upper surface. The first non-light-control region 113 further reaches the adjacent projection 211. That is, at this time, a plurality of projections 211 is connected in the component region 210 regardless of connection with the outer peripheral region 220. The projections may be connected to each other via the outer peripheral region 220. At this time, the projections may be connected to each other only via the outer peripheral region 220.

An intermediate region may be present between the first light control region 111 and the second light control region 112 as described above, but there is no intermediate region between the first light control region 111 and the first non-light-control region 113. Also, there is no intermediate region between the second light control region 112 and the second non-light-control region 114. This is because the first non-light-control region 113 is provided as a result of formation of the first light control region 111, and the second non-light-control region 114 is provided as a result of formation of the second light control region 112. This point will be described in further detail with reference to FIGS. 4 and 5.

Figure 4:
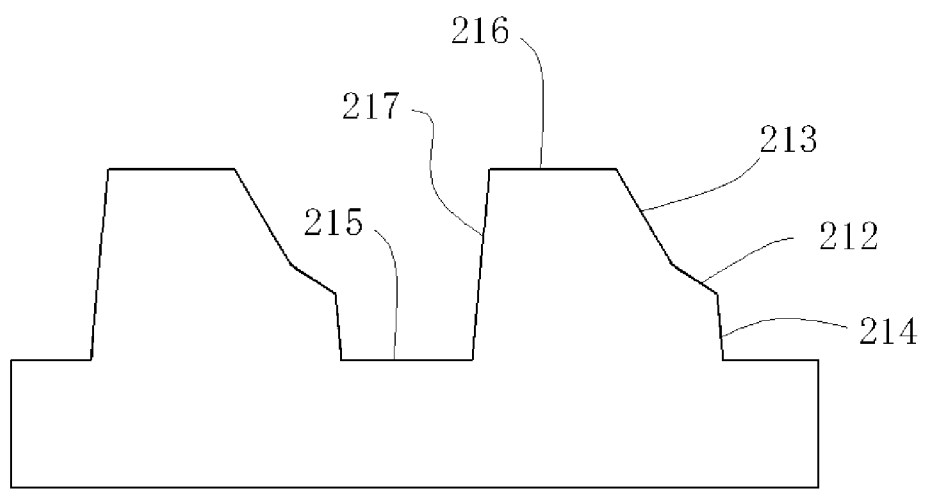
FIG. 4 is a schematic diagram for illustrating a shape of a base formed to match a mold.
Figure 5:
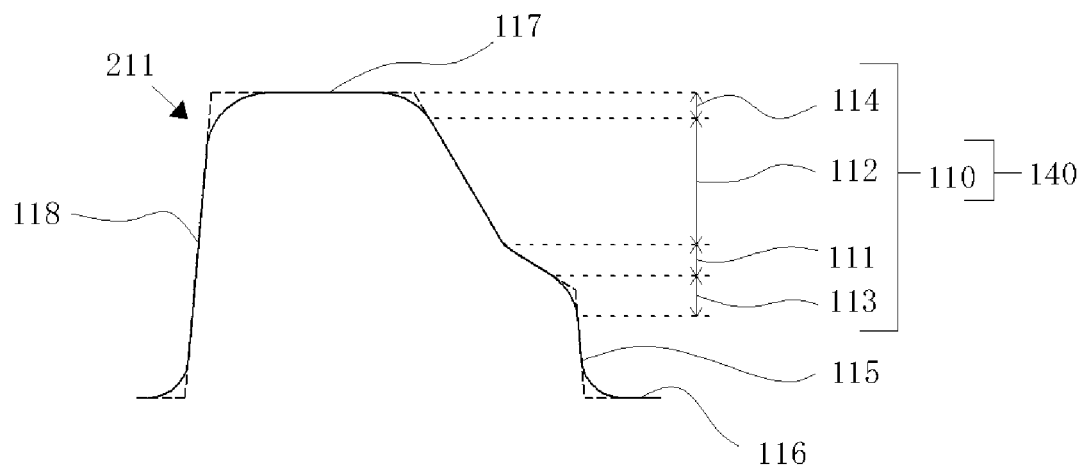
FIG. 5 is a schematic diagram for illustrating a shape of a base molded with a mold.

FIG. 4 is a diagram showing the shape of the projections 211 formed using the mold assuming the projection 211 is exactly fitted in the mold. FIG. 5 is a diagram showing a comparison of the shape of the mold with the shape of the projection 211 where the projection 211 is molded using the mold. In FIG. 5, the broken line indicates the shape of the mold in FIG. 4, and the solid line indicates the shape of the projection 211 molded.

As shown in FIG. 4, if the projection 211 is formed by being exactly fitted in the mold, a second light control region 213 meets an uppermost surface 216, and meets a first light control region 212 at a side on the opposite side. At a side on a side opposite to the side meeting the second light control region 213, the first light control region 212 meets an adjustment surface 214 for adjusting the height from the lower surface of the optical component 100 to the first light control region 212. At a side on a side opposite to the side meeting the first light control region 212, the adjustment surface 214 meets a connection surface 215 which is a flat surface connecting adjacent projections 211. At a side on a side opposite to the side meeting the adjustment surface 214, the connection surface 215 meets a lateral surface 217 on a side opposite to the surface of the neighbor projection 211 on which the light reflecting surface is formed. The connection surface 215 is provided under the uppermost surface 216 of the projection 211 and above the lower surface of the base 200.

Further, the boundary between the first light control region 212 and the second light control region 213, the boundary between the first light control region 212 and the adjustment surface 214, the boundary between the adjustment surface 214 and the connection surface 215, the boundary between the connection surface 215 and the lateral surface 217 of the neighbor projection 211, the boundary between the second light control region 213 and the uppermost surface 216, and the boundary between the uppermost surface 216 and the lateral surface 217 of the projection 211 are all angular. In the present embodiment, the phrase "the boundary is angular" means that the boundary has an angle and no roundness. However, the shape of the projection 211 is formed by being exactly fitted in the mold, the boundary is angular within the bounds of following the shape of the mold.

As shown in FIG. 5, a shape of the projection 211 actually molded from the mold is not the same as the shape of the projection 211 exactly fitted in the mold. Comparison between these shapes shows that the actually molded shape of the projection 211 has a roundness at and near the boundary. When the shape of the mold has such roundness, the roundness of the actually formed projection is larger than the roundness of the mold.

Therefore, with regard to a portion formed in conformity to the mold, the first light control region 111, the second light control region 112, an adjustment surface 115, a connection surface 116, an uppermost surface 117 and a lateral surface 118 on a side opposite to a surface at which a light reflecting surface is to be formed are respectively smaller in size than the first light control region 212, the second light control region 213, the adjustment surface 214, the connection surface 215, the uppermost surface 216 and the lateral surface 217.

This is attributed to such a nature that it is difficult to correctly transfer fine shapes of the mold due to the viscosity of glass, and the like. Consequently, the first non-light-control region 113 is formed between the first light control region 111 and the adjustment surface 115 in a region corresponding to the boundary between the first light control region 212 and the adjustment surface 214 and the vicinity of the boundary. Similarly, the second non-light-control region 114 is formed between the second light control region 112 and the uppermost surface 117 in a region corresponding to the boundary between the second light control region 213 and the uppermost surface 216 and the vicinity of the boundary.

This roundness becomes larger as the angle formed by two meeting surfaces decreases. An angle less than 180 degrees is more likely to be rounded. Therefore, a roundness generated at the boundary between the first light control region 212 and the second light control region 213 is smaller than a roundness generated at the boundary between the first light control region 212 and the adjustment surface 214 and/or at the boundary between the second light control region 213 and the uppermost surface 216. Hence, a roundness generated between the first light control region 111 and the second light control region 112 is not shown in the drawings.

This fact does not indicate that a roundness is not generated between the first light control region 111 and the second light control region 112. The present disclosure disclosed on the basis of the optical component 100 according to the embodiment is applicable regardless of whether or not the optical component 100 is absolutely required to have a roundness between the first light control region 111 and the second light control region 112.

The rounded shape in the first non-light-control region 113 is smoothly continued from the first light control region 111, and also smoothly continued from the adjustment surface 115. The rounded shape in the second non-light-control region 114 is smoothly continued from the second light control region 112, and also smoothly continued from the uppermost surface 117 of the projection 211. The term "smoothly continued" refers to a state of being free from an angle, as opposed to an angular state.

Therefore, when the first light control region 111 and the second light control region 112 are to be provided in a desired size, a mold is designed on the premise that a non-light-control region is formed. The roundness is generated under the influence of the viscosity of glass, or the like. Thus, depending on the degree of the influence, the first non-light-control region 113 and the second non-light-control region 114 formed on a projection 211 molded in a base 200 is not necessarily identical in shape to the first non-light-control region 113 and the second non-light-control region 114 formed on another projection 211 molded in the base 200.

When only the first light control region 111 is present as a light control region on the light reflecting surface 110, the second non-light-control region 114 is smoothly continued from the first light control region 111, and smoothly continued from the uppermost surface 117. That is, from the first light control region 111, the first non-light-control region 113 and the second non-light-control region 114 are respectively smoothly continued to the adjustment surface side and the uppermost surface side.

After projection 211 of the base 200 is formed with the mold in this way, a reflecting film is deposited by a method such as vapor deposition or sputtering on a lateral surface on a side on which the light reflecting surface 110 of the optical component 100 is to be formed.

Specifically, the light reflecting surface 110 can be formed by depositing a multilayer film of $Ta_2O_5$ and $SiO_2$, a multilayer film of $TiO_2$ and $SiO_2$, or the like. In addition, a metallic material having a high reflectivity, such as silver may be used as a reflecting film to form the light reflecting surface 110.

In the base 200, a plurality of projections 211 is arranged such that the first light control regions 111 of the light reflecting surfaces 110 of the respective projections 211 are parallel to one another, and similarly, the second light control regions 112 are parallel to one another. A plurality of projections 211 is formed so as to face in the same direction as described above, thus thickness unevenness is less likely to occur in deposition of the reflecting film. Therefore, among a plurality of optical components 100 manufactured from the same base 200, the uniformity of the light reflecting surface 110 is improved, and a high reflectivity can be obtained at the entire light reflecting surface 110.

After the light reflecting surface 110 is formed, a sheet material 900 is bonded to the uppermost surface 117 of the projection 211, and the lower surface of the base 200 is ground. For the sheet material 900, for example, an ultraviolet ray-curable dicing tape can be used. Besides the method using a sheet material, for example, an adhesive such as a wax can be used to fix the projections 211.

Figure 6:
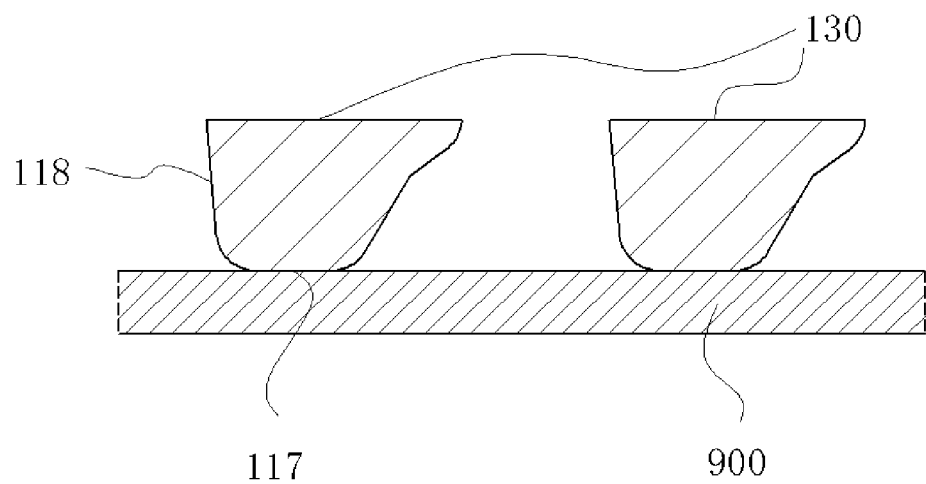
FIG. 6 is a schematic sectional view showing a state of the optical component in one of the steps in the manufacturing method thereof.

FIG. 6 shows a state of the projections 211 after the lower surface of the base 200 is ground. As shown in FIG. 6, in this step, the connection surface 116 connecting a plurality of projections 211 in the component region 210 is removed. The component region 210 and the outer peripheral region 220 are connected to each other in the base 200, thus arrangement of a plurality of projections 211 is maintained.

The lower surface 130 of the optical component 100 is formed by the grinding. How much thickness is cut in this step depends on how much height is secured between the lower surface 130 and the first light control region 111 in the optical component 100. In the present embodiment, grinding is performed such that at least a part of first non-light-control regions 113 remain. When it is not necessary to secure the height from the lower surface 130 to the first light control region 111, grinding can be performed such that the first non-light-control region 113 does not remain. In contrary, grinding may be performed such that part of the adjustment surface 115 remains in addition to the first non-light-control region 113.

The method for forming the lower surface 130 of the optical component 100 is not required to be grinding. A method other than grinding can be used as long as processing for forming the lower surface 130 of the optical component 100 can be performed. For example, using a method such as etching by which a surface is dissolved with hydrogen fluoride or the like, or polishing such as sand blasting by which sand is sprayed to grind a surface, processing may be performed by which part of the base 200 is removed from the lower surface side until reaching the lower surface 130 of the optical component 100.

After the lower surface 130 of the optical component 100 is formed, the sheet material 900 is bonded to the lower surface 130 of the optical component 100, and the uppermost surface 117 of the projection 211 is ground. In the present embodiment, for the sheet material 900, for example, an ultraviolet ray-curable dicing tape can be used. Further, instead of the sheet material, an adhesive such as a wax can be used.

Figure 7:
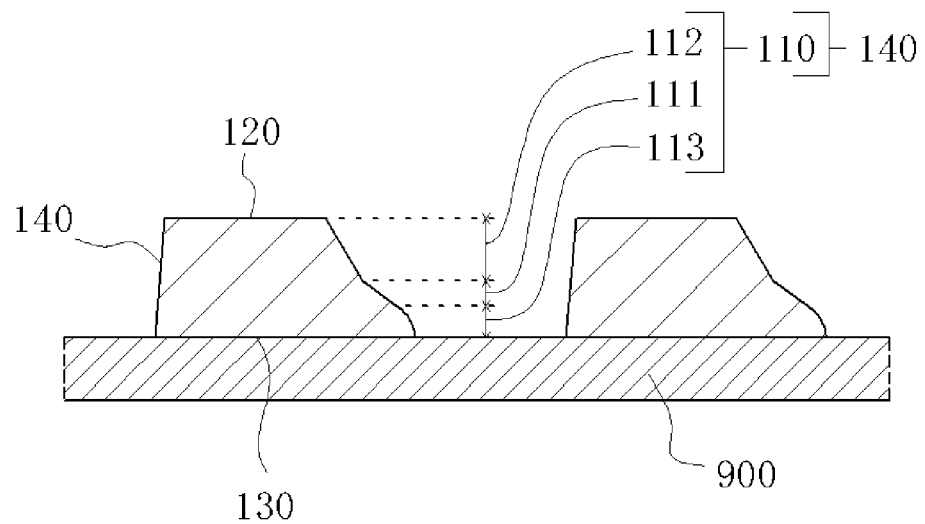
FIG. 7 is a schematic sectional view showing a state of the optical component in one of the steps on the manufacturing method thereof.

The sheet material 900 bonded to the uppermost surface 117 is removed before the uppermost surface 117 of the projection 211 is ground. FIG. 7 shows a state in which the uppermost surface 117 of the projection 211 is ground. How much thickness is cut from the uppermost surface 117 is determined by measuring the thickness of the projection 211.

The thicknesses of individual projections 211 are measured because there is a variance in the thickness. From the results of the measurements, the thickness of the component region 210 to be ground is determined. For example, an average of grinding thicknesses determined from individual projections 211 can be determined as a grinding thickness for a plurality of projections 211. Further, the grinding thickness for individual projections 211 can be determined from the measurement results of individual projections 211.

By the grinding, the second non-light-control region 114 is removed. Grinding is performed such that the second light control region 112 remains. Consequently, the upper surface 120 of the optical component 100 is formed, and the upper surface 120 and the second light control region 112 meet each other such that the boundary therebetween is angular. At least as compared to a state in which the first light control region 111 and the first non-light-control region 113 are smoothly continued, the boundary between the upper surface 120 and the second light control region 112 is angular. While the thickness to be ground varies depending on the size and the thickness of the projection 211, the size of the second non-light-control region 114, and the like, for example, a thickness of 100 μm to 2000 μm is ground.

Further, by the step of forming the upper surface 120 of the optical component 100, and the step of forming the lower surface 130 of the optical component 100, the light reflecting surface 110 of the optical component 100, and the lateral surface 140 on a side opposite to the light reflecting surface 110 are formed.

Even when a reflecting film is partially deposited on the uppermost surface 117 of the projection 211 in the above-described step of depositing a reflecting film, this grinding step produces a state in which there is no reflecting film formed on and the material of the base 200 is exposed at the upper surface 120 of the optical component 100. Therefore, by accurately performing grinding such that the surface roughness of the ground surface decreases, the lower surface 130 can be seen through the upper surface 120 of an optical component in the case in which the base 200 has high transparency. Thus, it is preferable to perform grinding such that the surface has an arithmetic average roughness Ra of 0.1 μm at most.

In the present embodiment, processing for forming the upper surface 120 of the optical component 100 may be performed using a method other than the grinding such as etching. These methods may be combined. For example, a method may be employed in which the upper surface 120 and the lower surface 130 of the optical component 100 are formed by removing the surface to a certain degree by sand blasting, and performing grinding for reducing the surface roughness.

The step of grinding the lower surface of the base 200 may be carried out after the step of grinding the uppermost surface 117 of the projection 211. In this case, a sheet material is bonded to the lower surface of the base 200, and the uppermost surface 117 of the projection 211 is ground to form the upper surface 120 of the optical component 100, followed by bonding a sheet material to the upper surface of the optical component 100, and grinding the lower surface of the base 200 to form the lower surface 130 of the optical component 100. With regard to the order, the sheet material may be bonded first to a surface having a smaller degree of warpage with consideration for the degree of warpage of the base provided with the projection 211. With this order, effect of the warpage caused by grinding can be reduced. Therefore, the lower surface of a base 200 having a large degree of warpage may be ground first.

Figure 8:
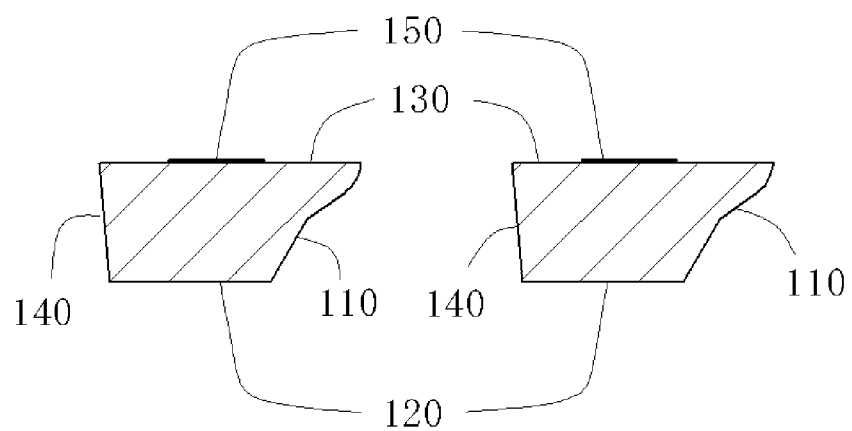
FIG. 8 is a schematic sectional view showing a state of the optical component in one of the steps in the manufacturing method thereof.
Figure 9:
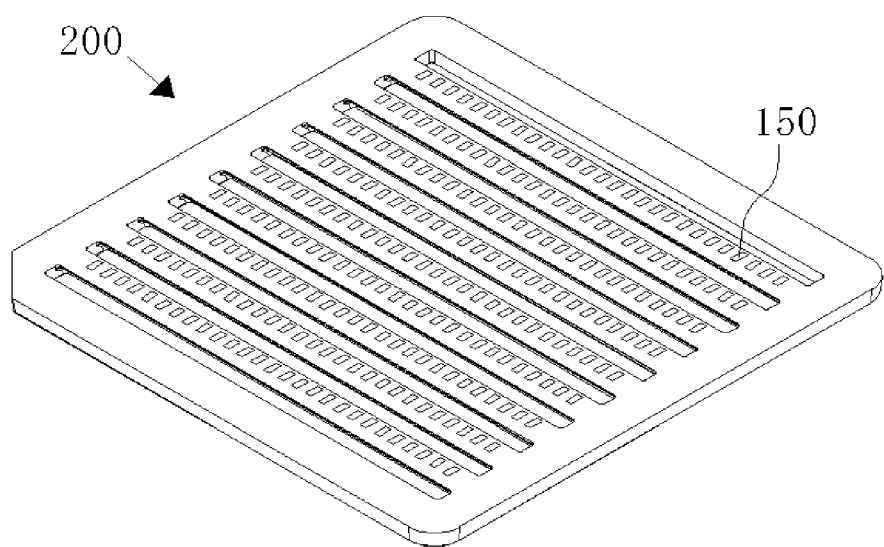
FIG. 9 is a perspective diagram showing a state of the optical component in one of the steps according to the manufacturing method thereof.

After the upper surface of the optical component 100 is formed, a metal film 150 is provided on the lower surface 130 of the optical component 100. The sheet material bonded to the lower surface 130 of the optical component 100 is removed. FIG. 8 shows a state in which the metal film 150 is provided on the lower surface 130 of the optical component 100. FIG. 9 shows a state of the base 200 at the time when the metal film 150 is provided on the lower surface 130 of the optical component 100. The metal film 150 can be formed by depositing a metal such as Au or AuSn by a method such as vapor deposition or sputtering while a region on which the metal film 150 is not intended to be provided is covered with a mask.

Figure 10:
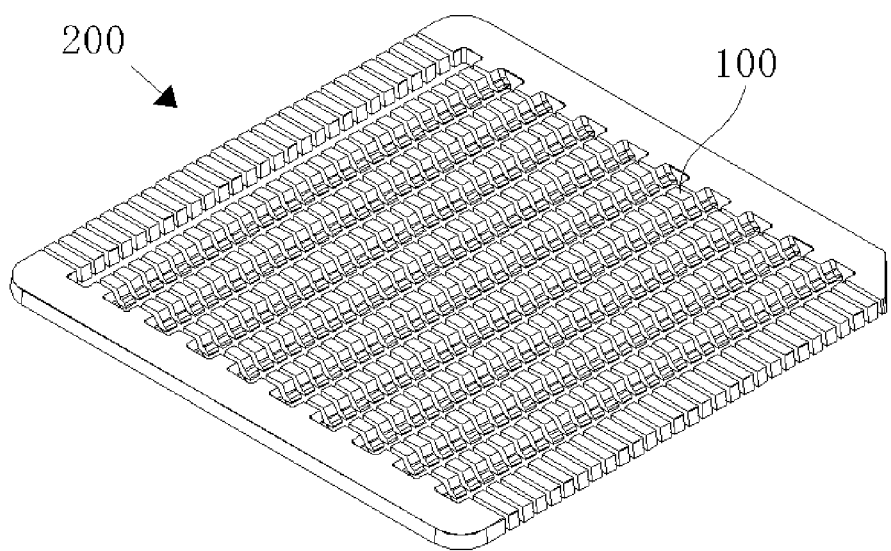
FIG. 10 is a perspective diagram showing a state of the optical component in one of the steps according to the manufacturing method thereof.

Subsequently, in a state in which a sheet material bonded to the lower surface 130 of the optical component 100, the base 200 is cut to divide projections 211 from one another, so that individual optical components 100 are formed. For the sheet material, for example, an ultraviolet ray-curable dicing tape can be used. FIG. 10 shows a state in which the base 200 is cut. Cut surfaces obtained by cutting form two lateral surfaces 140 of the optical component 100, where the lateral surfaces 140 are each different from a lateral surface 140 forming the light reflecting surface 110, and meet the lateral surface 140 forming the light reflecting surface 110. When the base has high transparency, the metal film provided on the lower surface 130 is visible from the upper surface side of the optical component 100, and therefore cutting can be performed while the position of the metal film is checked from the upper surface side.

The method for dividing the base into optical components 100 is not limited to cutting. A method other than cutting can be used as long as processing for forming two lateral surfaces 140 of the optical component 100 which meet the light reflecting surface 110 can be performed. For example, a method can also be used in which the base is scribed by a diamond scribing cutter or laser irradiation, and then cleaved by breaking.

In this way, a plurality of optical components 100 is manufactured from the base 200. With this manufacturing method, a large number of optical components 100, for example 10 or more optical components 100 can be manufactured from one base 200. When manufacturing the same size of the optical components 100, as the size of the base 200 increases, the size of the component region 210 increases. This can increase the number of optical components 100 manufactured from one base 200. On the other hand, when the size of the component region 210 increases, there may be an effect such as reduction in the accuracy of the optical component 100 manufactured. For example, when the number of optical components 100 manufactured from one base 200 is 3000 or less, mass productivity can be improved while maintaining accuracy. However, it depends on the size of the optical components 100.

Light Emitting Device 300

Figure 11:
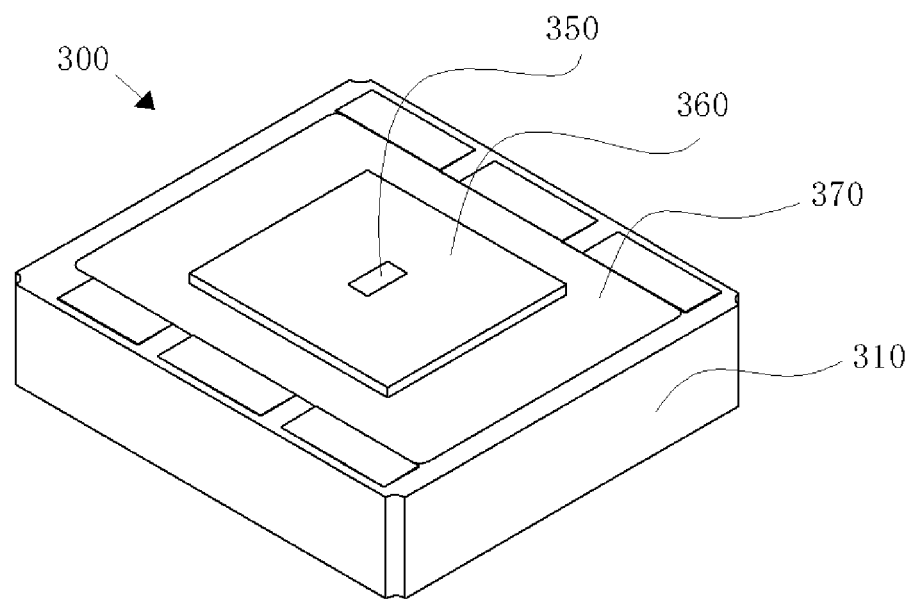
FIG. 11 is a perspective view showing one example of a light emitting device in which the optical component according to the embodiment is mounted.
Figure 12:
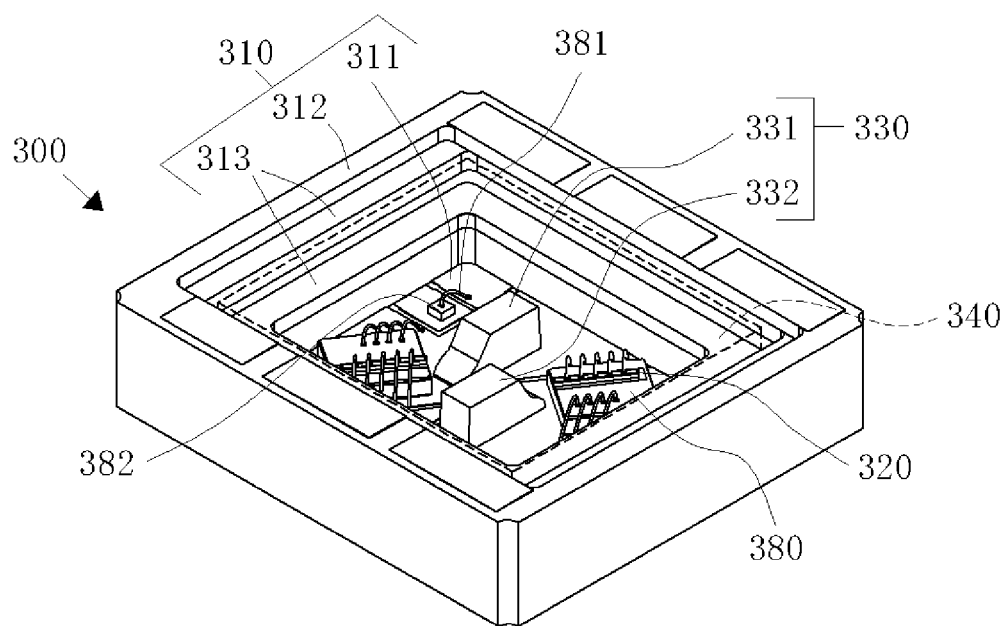
FIG. 12 is a perspective view for illustrating an internal arrangement in the light emitting device in which the optical component according to the embodiment is mounted.
Figure 13:
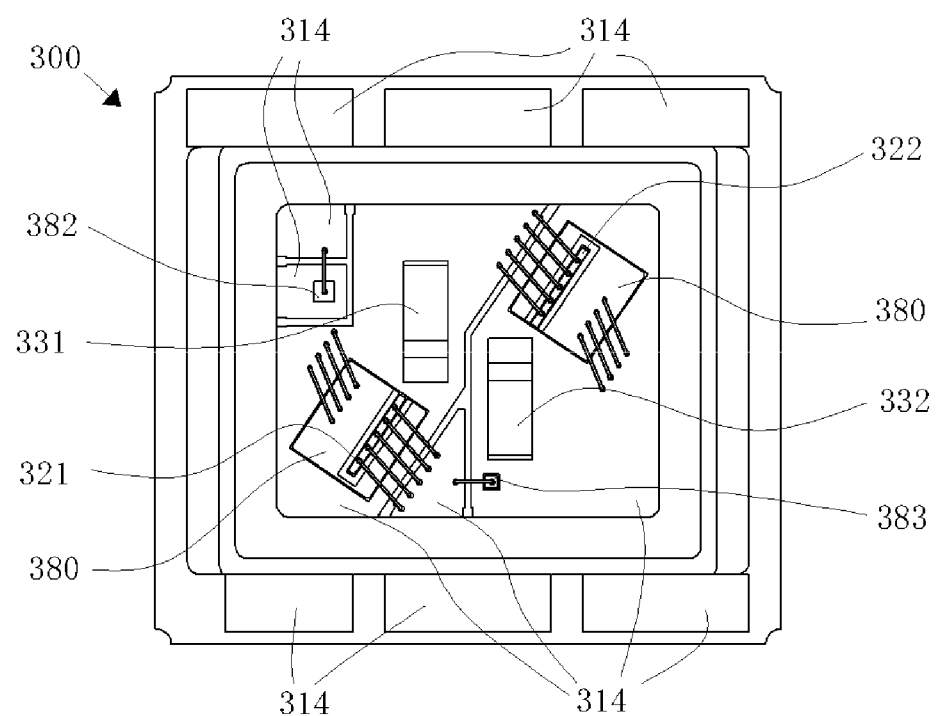
FIG. 13 is a top view for illustrating an arrangement of the optical component in the light emitting device in which the optical component according to the embodiment is mounted.

A light emitting device 300 in which the optical component 100 according to the embodiment is arranged will now be described with reference of FIGS. 11 to 13. FIG. 11 is a perspective view of the light emitting device 300. FIG. 12 is a perspective view of the light emitting device 300, where some of constituent elements are not shown and some of constituent elements are seen through for illustrating the arrangement of the optical component 100 in the light emitting device 300. The seen-through constituent elements are indicated by broken lines, and the extension lines of these constituent elements are indicated by broken lines. FIG. 13 is a top view of the light emitting device 300 shown in FIG. 12. The constituent elements not shown and the constituent elements seen through in FIG. 12 are both not shown in FIG. 13.

The light emitting device 300 includes a base member 310, a semiconductor laser element 320, a light reflecting member 330 as the optical component 100 according to the embodiment, a lid 340, a fluorescent portion 350, a first light shielding portion 360, a second light shielding portion 370, a sub-mount 380, a wire 381, a thermistor 382, and a Zener diode 383. Further, two semiconductor laser elements 320, and two light reflecting members 330 corresponding to the respective semiconductor laser elements 320 are present.

The base member 310 is provided with a recess depressed at a central portion thereof. The recess of the base member 310 has a first upper surface 311, a second upper surface 312 positioned above the first upper surface 311, and one or more step surfaces 313 positioned above the upper surface 311 and under the second upper surface 312. That is, the recess has one or more step surfaces 313 provided stepwise from the first upper surface 311 in such a manner as to reach the second upper surface 312 at the tip of the step. The first upper surface 311 is surrounded by the second upper surface 312. The first upper surface 311, the second upper surface 312 and the upper surface in the step surfaces 313 are substantially parallel to the lower surface of the base member 310.

The base member 310 has a plurality of wiring portions 314 provided in some regions of the first upper surface 311 and the second upper surface 312 of the recess formed of an insulating material. Providing the wiring portion 314 on surfaces other than the lower surface of the base member 310 can widen a region of the lower surface, which can be connected to a heat dissipation member such as a heat sink, thereby improving the effect of heat dissipation from the lower surface.

The recess of the base member 310 can be formed using a material containing a ceramic as a main component. Examples of the ceramic include aluminum oxide, aluminum nitride, silicon nitride and silicon carbide, and aluminum nitride is preferable from the viewpoint of heat dissipation. For the wiring portion 314, a metallic material such as gold, silver, aluminum, palladium or tungsten can be used. The base member 310 may have a base portion forming the first upper surface 311, and a frame portion, separately, the base member 310 being formed by providing the frame portion on the upper surface of the base portion.

Light radiated from the semiconductor laser element 320 has an elliptic far-field pattern (FFP) in which a length in a stacking direction of a plurality of semiconductor layers including an active layer is greater than a length in a direction perpendicular to the stacking direction on a surface parallel to a light emitting end surface of the semiconductor laser element 320. The FFP refers to a shape and a light intensity distribution of radiated light at a sufficient distance from the light emitting end surface of the semiconductor laser element 320. The FFP is utilized for, for example, measuring a light intensity distribution at a certain distance from the light emitting end surface using an angle with respect to an optical axis as a parameter, and showing a correlation between the light intensity and the angle as a graph to measure the properties of the semiconductor laser element 320.

As the semiconductor laser element 320, one having a peak emission wavelength within the range of 320 nm to 530 nm, typically within the range of 430 nm to 480 nm can be used. The semiconductor laser element 320 emits radiated light with relatively high energy. The semiconductor laser element 320 is preferably formed using a material containing, for example, a nitride semiconductor. Examples of the material including nitride semiconductor include those containing at least one of GaN, InGaN and AlGaN.

The lid 340 has a lower surface, an upper surface and lateral surfaces. Further, the lid 340 includes a light-transmissive inorganic material, and has, for example, a rectangular solid shape. The lid 340 may be formed using a material composed of sapphire which is relatively easily transmitting radiated light, has high physical strength and high heat conductivity. The lid 340 may be formed using a light-transmissive material containing quartz, silicon carbide, glass or the like.

The fluorescent portion 350 has a lower surface, an upper surface serving as a light extraction surface, and lateral surfaces. Further, the upper surface of the fluorescent portion 350 has a shape elongated in one direction, and the lower surface of the fluorescent portion 350 has a shape elongated in one direction. From the viewpoint of mass productivity, the upper surface and the lower surface of the fluorescent portion 350 each have a rectangular shape, but may have an elliptic shape. The fluorescent portion 350 has light-transmissivity, and contains a fluorescent material such as a YAG fluorescent material, a LAG fluorescent material or an a-sialon fluorescent material. In particular, it is preferable to use a YAG fluorescent material which has high heat resistance.

Further, the fluorescent portion 350 is composed of an inorganic material. Accordingly, as compared to a fluorescent portion containing an organic material, the fluorescent portion 350 is less affected by heat and light, thereby improving its reliability. As the fluorescent portion 350 composed of an inorganic material, a fluorescent material ceramic or a single crystal fluorescent material can be used. As the fluorescent material ceramic, a sintered body of fluorescent material particles and a binding agent serving as a binder can be used. In the case in which a fluorescent material ceramic of a YAG fluorescent material is used, aluminum oxide may be used as an additive material. A fluorescent material including an organic material may be used.

The first light shielding portion 360 has a lower surface, an upper surface, outer lateral surfaces and inner lateral surfaces. Further, a space surrounded by the inner lateral surface extends through the first light shielding portion from the upper surface to the lower surface. The first light shielding portion 360 can be formed using a ceramic containing aluminum oxide as a main component. Further, aluminum nitride or the like may be used other than aluminum oxide.

The second light shielding portion 370 can be formed of, for example, a resin containing light absorbing particles of carbon or the like. The sub-mount 380 has a lower surface, an upper surface and lateral surfaces, and has a rectangular solid shape. The sub-mount 380 can be formed using, for example, aluminum nitride or silicon carbide. The upper surface and the lower surface of the sub-mount 380 can be plated with copper to improve it heat dissipation. The wire 381 is metallic wiring, and is used for electrical connection. The thermistor 382 can be, for example, a ceramic. The Zener diode 383 can be, for example, a silicon diode.

The configuration of the light emitting device 300 will now be described.

In the light emitting device 300, two semiconductor laser elements 320 are each disposed on the first upper surface 311 of the base member 310 with the sub-mount 380 interposed therebetween. Further, two light reflecting members 330 are arranged on the first upper surface 311 of the base member 310 to reflect light radiated from the respective semiconductor laser elements 320. Further, the thermistor 382 and the Zener diode 383 are arranged on the first upper surface 311 of the base member 310. A plurality of wires 381 is each bonded to the semiconductor laser element 320, the thermistor 382 or the Zener diode 383 at one end, and bonded to the wiring portion 314 of the first upper surface 311 at the other end.

The semiconductor laser element 320 is disposed such that the light emitting surface of the semiconductor laser element is perpendicular to the first upper surface 311 of the base member 310, and the longitudinal direction of the FFP having an elliptic shape is perpendicular to the first upper surface 311 of the base member 310. This ensures that a surface of the semiconductor laser element 320, which has a larger area, can be bonded to the upper surface of the sub-mount 380, so that heat generated by the semiconductor laser element 320 is easily dissipated to the base member 310 through the sub-mount 380. The term "perpendicular" encompasses an inclination allowing for a shift during manufacturing. Such inclination encompasses, for example, an inclination of about ±10 degrees.

Interposition of the sub-mount 380 can increase the distance (i.e., height) between the first upper surface 311 of the base member 310 and the light emitting point of the light emitting surface of the semiconductor laser element 320 by an amount equivalent to the thickness of the sub-mount 380. Accordingly, the light reflecting member 330 can be efficiently irradiated with light emitted from the semiconductor laser element 320.

Thus, with respect to the first upper surface 311, the boundary between the first non-light-control region 113 and the first light control region 111 is positioned above the lower surface of the sub-mount 380, and it is desirable that the height from the lower surface of the light reflecting member 330 to the boundary between the first non-light-control region 113 and the first light control region 111 be smaller than the thickness from the lower surface to the upper surface of the sub-mount 380. That is, it is desirable that the boundary between the first non-light-control region 113 and the first light control region 111 be positioned above the lower surface and under the upper surface of the sub-mount 380.

Further, the thickness from the lower surface to the upper surface of the sub-mount 380 is preferably smaller than the height from the lower surface to the upper surface of the light reflecting member 330. Further, the thickness from the lower surface to the upper surface of the sub-mount 380 is more preferably equal to the height up to the boundary between the first light control region 111 and the second light control region 112.

The sub-mount 380 is preferably a sub-mount having a thermal expansion coefficient between the thermal expansion coefficient of the base member 310 and the thermal expansion coefficient of the semiconductor laser element 320. This can alleviate delamination of the semiconductor laser element 320 or the sub-mount 380. When a material containing a nitride semiconductor is used for the semiconductor laser element 320, it is preferable to use aluminum nitride or silicon carbide for the sub-mount 380.

The light reflecting member 330 is disposed such that the light reflecting surface 110 is irradiated with light emitted from the semiconductor laser element 320. Further, the semiconductor laser element 320 is closer to the first light control region 111 than to the second light control region 112 side. Of two light reflecting members 330, a first light reflecting member 331 reflects a major part of light from a first semiconductor laser element 321, and a second light reflecting member 332 reflects a major part of light from a second semiconductor laser element 322 of two semiconductor laser elements 320.

In this specification, a major part of light from the semiconductor laser element 320 may be light having a light intensity equal to or greater than $1/e^2$ of the peak intensity value. In the light emitting device 300, a major part of the light may be preferably light having a light intensity equal to or greater than 5% of the peak intensity value. A major part of the light may be more preferably light having a light intensity equal to or greater than 1% of the peak intensity value.

That is, in the light emitting device 300, the first light control region 111 and the second light control region 112 of the light reflecting member 330 are regions which are irradiated with at least a major part of light in light emitted from the semiconductor laser element 320. Further, the first non-light-control region 113 is a region which is not irradiated with at least a major part of light in light emitted from the semiconductor laser element 320. Therefore, the first non-light-control region 113 may be irradiated with light other than a major part of light.

An angle A formed by the lower surface of the light reflecting member 330 with the first light control region 111 is smaller than an angle B formed by the lower surface of the light reflecting member 330 with the second light control region 112. For example, the angle A is larger than 15 degrees and smaller than 45 degrees, and the angle B is larger than 45 degrees and smaller than 75 degrees.

As shown in FIG. 13, the first semiconductor laser element 321 and the second semiconductor laser element 322 are arranged such that the light emitting end surfaces of the semiconductor laser elements are parallel to each other.

Further, in a top view, a straight line perpendicular to the emitting end surface of the first semiconductor laser element 321 is neither perpendicular nor parallel to a straight line passing through the boundary between the first light control region 111 and the second light control region 112 of the first light reflecting member 331. In other words, in a top view, the first semiconductor laser element 321 and the first light reflecting member 331 are inclined to each other. Similarly, the second semiconductor laser element 322 and the second light reflecting member 332 are inclined to each other. The arrangement relation of the first light reflecting member 331 to the first semiconductor laser element 321 is the same as the arrangement relation of the second light reflecting member 332 to the second semiconductor laser element 322.

In a top view, an angle α is formed by a straight line perpendicular to the emitting end surface of the first semiconductor laser element 321 and a straight line passing through the boundary between the first light control region 111 and the second light control region 112 of the first light reflecting member 331. The angle α which is on the first light control region 111 and first semiconductor laser element 321 side is preferably in the range of 30 degrees to 80 degrees. The same applies to the second semiconductor laser element 322 and the second light reflecting member 332. When the angle α is within this range, excessive expansion of light reflected by the light reflecting member 330 can be alleviated. It is more effective to set the angle α within the range of 30 degrees to 40 degrees.

Further, the first light reflecting member 331 and the second light reflecting member 332 are arranged such that the boundary lines of the first light control region 111 and the second light control region 112 are parallel to each other. Such arrangement enables one fluorescent portion 350 is irradiated with light from two semiconductor laser elements 320. The term, "parallel" includes an inclination equivalent to a shift during manufacturing, for example an inclination of about ±10 degrees.

The wires 381 and the thermistor 382 are bonded to a plurality of wiring portions 314 provided on the first upper surface 311 of the base member 310. Parts of a plurality of wiring portions 314 on the first upper surface 311 are respectively electrically connected to parts of a plurality of wiring portions 314 on the second upper surface 312 through an electrically conductive member provided in the base member 310. This enables the semiconductor laser elements 320 and the thermistors 382 to be electrically connected to the outside through a plurality of wiring portions 314 on the second upper surface 312 of the base member 310. By providing the thermistor 382, the temperature of the semiconductor laser element 320 can be measured, and a current passing through the semiconductor laser element 320 can be adjusted in response to a temperature change.

The lid 340 is disposed on the upper surface of the step surface 313 of the base member 310. A metal film is formed on each of bonding regions in the lower surface of the lid 340 and the upper surface of the step surface 313 of the base member 310, and the metal films are fixed together with solder. The lid 340 is bonded over the entire periphery of the upper surface of the step surface 313 of the base member 310 to form a hermetically sealed space. The semiconductor laser element 320 and the like are disposed in this space. Forming such a hermetically sealed space can alleviate collection of organic substances and the like on the light emitting surface of the semiconductor laser element 320. As the base member 310, one having no step surface 313 may be used, and in this case, the lid 340 is disposed on a surface corresponding to the second upper surface 312 of the base member 310.

The fluorescent portion 350 is disposed on the upper surface of the lid 340. Light emitted from the semiconductor laser element 320 is reflected by the light reflecting member 330, and passes through the lid 340 to enter the fluorescent portion 350. Light incident to the fluorescent portion 350 passes through the fluorescent portion 350 to exit the light emitting device 300. Therefore, the fluorescent portion 350 is a light extraction surface of the light emitting device 300.

On the lower surface of the fluorescent portion 350, a major part of light emitted from the semiconductor laser element 320 is applied in a shape elongated in one direction. The fluorescent portion 350 is disposed such that the longitudinal-direction size of the irradiated region on the lower surface of the fluorescent portion 350 is within the longitudinal-direction size of the lower surface of the fluorescent portion 350. For example, the fluorescent portion 350 is disposed such that the longitudinal direction of the fluorescent portion 350 is perpendicular to the boundary line between the first light control region 111 and the second light control region 112 in a top view. Therefore, the first light control region 111 and the second light control region 112 of the light reflecting member 330 allow a major part of light from the semiconductor laser element 320 to advance toward the light extraction surface in the light emitting device 300.

Further, the center of the fluorescent portion 350 is positioned within a range surrounded by a straight line passing through each of the boundary lines between the upper surfaces 120 and the second light control regions 112 in two light reflecting members 330 and lateral surfaces which meet both the boundary lines and is closer to the fluorescent portion 350, in a top view. The fluorescent portion 350 may have a fluorescent portion having a width-direction size smaller than the longitudinal-direction size of the irradiated region on the lower surface of the fluorescent portion 350. Further, heat generated at the fluorescent portion 350 can be dissipated to the base member 310 through the lid 340.

The first light shielding portion 360 is provided so as to surround the lateral side of the fluorescent portion 350. That is, the first light shielding portion 360 is provided such that the fluorescent portion 350 is provided within a through-hole defined by the inner lateral surfaces of the first light shielding portion 360 as seen from the upper surface side of the fluorescent portion 350. By surrounding the lateral surfaces of the fluorescent portion 350 by the first light shielding portion 360, light is less likely to emit from parts other than the upper surface of the fluorescent portion 350.

In the case in which the fluorescent portion 350 contains a YAG fluorescent material, it is preferable that a ceramic containing aluminum oxide as a main component is used for the first light shielding portion 360. The fluorescent portion 350 may be directly joined to the first light shielding portion 360 by a sintering method. At that time, an opening is generated in a region close to the fluorescent portion 350 of the first light shielding portion 360. Light from the fluorescent portion 350 is reflected at the interface between a particle of aluminum oxide or the like and the opening, so that the first light shielding portion 360 hardly transmits light.

The second light shielding portion 370 is provided so as to cover part of the upper surface of the lid 340 and the lateral surfaces of the lid 340. This can alleviate leakage of emitted light and fluorescent light from the lateral side of the lid 340.

Effects of the optical component 100 according to the embodiment in the light emitting device 300 will now be described. The optical effect of the second light reflecting member 332 on a major part of light from the second semiconductor laser element 322 is the same as the optical effect of the first light reflecting member 331 on a major part of light from the first semiconductor laser element 321. Thus the optical effects of these members will be described on the basis of the first semiconductor laser element 321 and the first light reflecting member 331.

The first light reflecting member 331 changes a relative light distribution before reflection and after reflection by the first light control region 111 and the second light control region 112 such that a major part of light emitted from the first semiconductor laser element 321 exits from the fluorescent portion 350 as more uniform light.

For example, the first light reflecting member 331 is formed such that light reflected on a region of the first light control region 111 at a side close to the second light control region 112 and light reflected on a region of the second light control region 112 at a side close to the first light control region 111 meet each other before reaching the lower surface of the fluorescent portion 350, and both end portions of the irradiated region on the lower surface of the fluorescent portion 350 are irradiated with the light.

The first light reflecting member 331 is formed such that, for example, in the irradiated region on the lower surface of the fluorescent portion 350, the light intensity at each of both end portions in the longitudinal direction is higher than the light intensity at the central portion positioned away from both ends by equal distances.

Further, the first light reflecting member 331 is formed such that, for example, in a major part of light applied to the first light reflecting member 331, a part of light having a relatively low light intensity overlaps the other part of light on the lower surface of the fluorescent portion 350, and a part of light having a relatively high light intensity does not overlaps the other part of light on the lower surface of the fluorescent portion 350.

A method of mounting the optical component 100 according to the embodiment in the light emitting device 300 will now be described.

A plurality of optical components 100 divided from the base 200 with a sheet material bonded to the optical components 100 is aligned on the sheet material as shown in FIG. 10. In this state, an ultraviolet ray is applied to make the adhesiveness of the sheet material ineffective, so that the optical components 100 are released from the sheet material. A plurality of aligned optical components 100 is mounted one by one. Thus, the optical components 100 are efficiently picked up and mounted.

Further, the optical component 100 is picked up by, for example, suctioning the upper surface 120 of the optical component 100 in vacuum using a mounter such as a die bonder. Here, the upper surface 120 of the optical component 100, which is accurately ground so as to reduce the surface roughness of the ground surface, has an advantage of facilitating maintenance of vacuum and having a good adsorption property. Thus, it is preferable to grind the upper surface 120 such that the surface roughness is 1.0 µm or less in terms of an arithmetic average roughness Ra.

In the light reflecting member 330, which is the optical component 100 according to the embodiment, the second non-light-control region 114 is ground, such that the boundary between the upper surface 120 and the second light control region 112 is angular. Thus the boundary line can be utilized for adjustment of the mounting position in the mounting step of disposing the light reflecting member 330 on the base member 310.

That is, if the second non-light-control region 114 remains, the upper surface 120 and the second light control region 112 are smoothly continued, and therefore it is difficult to define a unified boundary with the upper surface in a plurality of optical components 100. Thus, by grinding the second non-light-control region 114 so that the boundary between the upper surface and the second light control region 112 is angular, boundary lines can be accurately defined in a plurality of optical components 100, and utilized for position adjustment during mounting.

Although the optical component 100 according to the embodiment has been described above, optical components applicable to the disclosure in the present embodiment are not limited to those that reflect light. The disclosure in the present embodiment can be applied to, for example, optical components which transmit or refract light. Examples of such optical components include prisms. Therefore, optical components described in the present disclosure are not limited to those that reflect light unless otherwise specified.

The structure of a light emitting device having the optical component according to the present disclosure is not limited to the structure of the light emitting device 300 described above. The concepts described in the present disclosure can be applied to, for example, a light emitting device having a constituent element that is not included in the light emitting device 300, and presence of a difference between such a light emitting device and the light emitting device 300 does not give the reason why the present disclosure cannot be applied.

That is, applicability of the present disclosure to a light emitting device does not necessarily require that this light emitting device necessarily and sufficiently has all the constituent elements of the light emitting device 300 disclosed above. For example, when some of the constituent elements of the light emitting device 300 of the embodiment are not described in the claims, those constituent elements are given a degree of freedom of design by those skilled in the art in substitution, omission, modification of shapes, change of materials and the like, without being limited to the constituent elements disclosed in the embodiment, and the claims may still apply to such a device.

The optical components described in the embodiments can be used for on-vehicle headlights, projectors, illuminations, backlights for displays, and the like.

What is claimed is:

1. An optical component comprising:
   an upper surface;
   a lower surface;
   a first light reflecting surface extending partially between the upper surface and the lower surface, the first light reflecting surface comprising a flat surface; and
   a rounded surface formed between the first light reflecting surface and the lower surface;
   wherein an angular edge is located at a first light reflecting surface side of the upper surface.

2. The optical component according to claim 1, comprising:
   a second light reflecting surface formed between the upper surface and the first light reflecting surface, the second light reflecting surface comprising a flat surface;
   wherein an angle between the second light reflecting surface and the lower surface is different from an angle between the first light reflecting surface and the lower surface; and
   wherein the angular edge is a boundary between the upper surface and the second light reflecting surface.

3. The optical component according to claim 2, wherein a roundness of the rounded surface is larger than a roundness of a surface between the first light reflecting surface and the second light reflecting surface.

4. The optical component according to claim 1, wherein the rounded surface is continuous with the first light reflecting surface.

5. The optical component according to claim 1, wherein:
   a principal material of the optical component is glass; and
   the first light reflecting surface is a surface of a reflecting film on the glass.

6. The optical component according to claim 5, wherein the upper surface has transparency and an arithmetic average roughness Ra of 0.1 μm at most.

7. A light emitting device comprising:
   a base member comprising an upper surface;
   at least one semiconductor laser element disposed on the upper surface of the base member; and
   at least one optical component that is located on the upper surface of the base member and comprises:
      an upper surface,
      a lower surface,
      a first light reflecting surface extending partially between the upper surface and the lower surface, the first light reflecting surface comprising a flat surface, and
      a rounded surface formed between the first light reflecting surface and the lower surface,
      wherein an angular edge is located at a first light reflecting surface side of the upper surface;
   wherein the at least one semiconductor laser element includes a first semiconductor laser element;
   wherein the at least one optical component includes a first optical component;
   wherein the first light reflecting surface of the first optical component is located so as to be irradiated with a major part of light emitted from the first semiconductor laser element; and
   wherein the rounded surface of the first optical component is located so as not to be irradiated with a major part of light emitted from the first semiconductor laser element.

8. The light emitting device according to claim 7, comprising:
   a sub-mount comprising an upper surface on which the first semiconductor laser element is disposed;
   wherein the first semiconductor laser elements is disposed on the upper surface of the base member via the sub-mount; and
   wherein the upper surface of the sub-mount is positioned above the rounded surface with respect to the first upper surface of the base member.

9. The light emitting device according to claim 8, wherein:
   the at least one semiconductor laser element includes a second semiconductor laser element disposed on the upper surface of the base member;
   the at least one optical component includes a second optical component disposed on the upper surface of the base member; and in a top view, the angular edge of the first optical component is parallel to the angular edge of the second optical component.

10. The light emitting device according to claim 9, wherein the rounded surface is continuous with the first light reflecting surface.

11. The light emitting device according to claim 9, wherein:
a principal material of the optical component is glass; and
the first light reflecting surface is a surface of a reflecting film on the glass.

12. The light emitting device according to claim 9,
wherein the upper surface of the first optical component has transparency and an arithmetic average roughness Ra of 0.1 μm at most;
wherein the upper surface of the second optical component has transparency and an arithmetic average roughness Ra of 0.1 μm at most.

13. A light emitting device comprising:
a base member comprising an upper surface;
at least one semiconductor laser element disposed on the upper surface of the base member; and
at least one optical component that is located on the upper surface of the base member and comprises:
an upper surface,
a lower surface,
a first light reflecting surface extending partially between the upper surface and the lower surface, the first light reflecting surface comprising a flat surface,
a second light reflecting surface formed between the upper surface and the first light reflecting surface, the second light reflecting surface comprising a flat surface,
a rounded surface formed between the first light reflecting surface and the lower surface,
wherein an angle between the second light reflecting surface and the lower surface is different from an angle between the first light reflecting surface and the lower surface, and
wherein an angular edge is located at a boundary between the upper surface of the base member and the second light reflecting surface;
wherein the at least one semiconductor laser element includes a first semiconductor laser element;
wherein the at least one optical component includes a first optical component;
wherein the first light reflecting surface and the second light reflecting surface of the first optical component are located so as to be irradiated with a major part of light emitted from the first semiconductor laser element; and
wherein the rounded surface of the first optical component is located so as not to be irradiated with a major part of light emitted from the first semiconductor laser element.

14. The light emitting device according to claim 13, comprising:
a sub-mount comprising an upper surface on which the first semiconductor laser element is disposed;
wherein the first semiconductor laser element is disposed on the upper surface of the base member via the sub-mount; and
wherein the upper surface of the sub-mount is positioned above the rounded surface with respect to the first upper surface and is positioned below the second light reflecting surface with respect to the upper surface of the base member.

15. The light emitting device according to claim 14, wherein:
the at least one semiconductor laser element includes a second semiconductor laser element disposed on the first upper surface;
the at least one optical component includes a second optical component disposed on the upper surface of the base member; and
in a top view, the angular edge of the first optical component is parallel to the angular edge of the second optical component.

16. The light emitting device according to claim 15, wherein a roundness of the rounded surface is larger than a roundness of a surface between the first light reflecting surface and the second light reflecting surface.

17. The light emitting device according to claim 15, wherein:
the rounded surface of the first optical component is continuous with the first light reflecting surface of the first optical component; and
the rounded surface of the second optical component is continuous with the first light reflecting surface of the second optical component.

18. The light emitting device according to claim 15,
wherein a principal material of the first optical component is glass;
wherein the first light reflecting surface of the first optical component is a surface of a reflecting film on the glass of the first optical component;
wherein a principal material of the second optical component is glass; and
wherein the first light reflecting surface of the second optical component is a surface of a reflecting film on the glass of the second optical component.

19. The light emitting device according to claim 15,
wherein the upper surface of the first optical component has transparency and an arithmetic average roughness Ra of 0.1 μm at most; and
wherein the upper surface of the second optical component has transparency and an arithmetic average roughness Ra of 0.1 μm at most.

* * * * *